US012581638B2

(12) United States Patent
Zhuang et al.

(10) Patent No.: US 12,581,638 B2
(45) Date of Patent: Mar. 17, 2026

(54) SEMICONDUCTOR MEMORY DEVICE HAVING INTERFACE LAYER BETWEEN CAPACITOR STRUCTURES AND METHOD OF FABRICATING THE SAME

(71) Applicant: Fujian Jinhua Integrated Circuit Co., Ltd., Quanzhou City (CN)

(72) Inventors: Liandie Zhuang, Quanzhou City (CN); Ronghui Lin, Quanzhou City (CN); Ling Li, Quanzhou City (CN); Wen-Yi Teng, Quanzhou City (CN); Tsun-Min Cheng, Quanzhou City (CN)

(73) Assignee: Fujian Jinhua Integrated Circuit Co., Ltd., Quanzhou City (CN)

( * ) Notice: Subject to any disclaimer, the term of this patent is extended or adjusted under 35 U.S.C. 154(b) by 694 days.

(21) Appl. No.: 17/880,671

(22) Filed: Aug. 4, 2022

(65) Prior Publication Data

US 2023/0422475 A1     Dec. 28, 2023

(30) Foreign Application Priority Data

Jun. 22, 2022   (CN) .......................... 202210716508.6
Jun. 22, 2022   (CN) .......................... 202221580061.6

(51) Int. Cl.
*H10B 12/00*              (2023.01)
(52) U.S. Cl.
CPC ............. *H10B 12/30* (2023.02); *H10B 12/03* (2023.02)
(58) Field of Classification Search
CPC ................................ H10B 12/30; H10B 12/03
See application file for complete search history.

(56) References Cited

U.S. PATENT DOCUMENTS

| | | | | |
|---|---|---|---|---|
| 9,054,228 B2 * | 6/2015 | Choi | ....................... | H01L 24/97 |
| 2004/0130849 A1 * | 7/2004 | Kurihara | ............. | H01L 23/5223 |
| | | | | 257/E27.048 |
| 2005/0266650 A1 | 12/2005 | Ahn | | |
| 2013/0320518 A1 * | 12/2013 | Chun | ....................... | H01L 24/97 |
| | | | | 257/712 |
| 2019/0074210 A1 * | 3/2019 | Su | ...................... | H01L 21/76283 |
| 2019/0198628 A1 * | 6/2019 | Li | ......................... | H10D 64/514 |
| 2019/0206753 A1 * | 7/2019 | Gaines | ................... | H01L 23/562 |
| 2022/0399287 A1 * | 12/2022 | Choi | .................... | H01L 25/0652 |
| 2023/0120573 A1 * | 4/2023 | Kusuyama | ............. | H01G 4/236 |
| | | | | 361/500 |

* cited by examiner

*Primary Examiner* — William B Partridge
*Assistant Examiner* — Felix B Andrews
(74) *Attorney, Agent, or Firm* — Winston Hsu

(57)                  ABSTRACT

The present disclosure provides a semiconductor memory device and a method of fabricating the same, with the semiconductor memory device including a substrate, a plurality of capacitor structures, a stress insulating layer, and at least one interface layer. The capacitor structures are separately disposed on the substrate, and each of the capacitor structures includes a plurality of capacitors. The stress insulating layer is disposed on the substrate to cover the capacitor structures. The interface layer is disposed within the stress insulating layer, between any two adjacent ones of the capacitor structures, wherein a tip portion of the at least one interface layer is higher than a top surface of each of the capacitor structures. In this way, the stress mode of the substrate may be adjusted through disposing the interface layer, so as to achieve the effect of eliminating redundant stress, and to improve the structural reliability of the device.

20 Claims, 6 Drawing Sheets

SEMICONDUCTOR MEMORY DEVICE HAVING INTERFACE LAYER BETWEEN CAPACITOR STRUCTURES AND METHOD OF FABRICATING THE SAME

BACKGROUND OF THE INVENTION

1. Field of the Invention

The present invention relates to a semiconductor memory device and a method of fabricating the same, in particular to a dynamic random access memory (DRAM) device and a method of fabricating the same.

2. Description of the Prior Art

Memory devices are indispensable and important parts in modern electronic products. In addition to memorize the user's data, the memory devices are also responsible for memorizing the program code executed by the central processing unit and the information that needs to be temporarily saved during the operation. Semiconductor memory devices may be classified into volatile memory devices and non-volatile memory devices. Data stored in a volatile memory device such as a dynamic random access memory (DRAM) or a static random access memory (SRAM) is erased when the volatile memory device is out of power supply, and must be re-entered at the next power supply.

Dynamic random access memory (DRAM) is an indispensable key component in many electronic products, and which is arranged from a large number of memory cells to form an array area for save information. Each memory cell consists of a metal oxide semiconductor (MOS) transistor and a capacitor in series. As the accumulation of DRAMs increases, it becomes more difficult to establish an electrical connection between each memory cell and each memory cell. At the same time, there are many different structural designs for the crystal structure and capacitor structure in each memory cell due to product requirements or/and density of memory cells. Therefore, how to develop a DRAM structure with maintaining performance and manufacturing process has always been the technical direction of continuous efforts in the field.

SUMMARY OF THE INVENTION

One of the objectives of the present disclosure provides a semiconductor memory device and a method of fabricating the same, in which a stress insulating layer is disposed between the capacitor structures which are separately from each other, so that an interface layer higher than the top surface of the capacitor structures may be generated in the stress insulation layer. Therefore, the stress mode of the substrate may be adjusted through disposing the interface layer, so as to compensate redundant stress and to strengthen the structural reliability of the device.

To achieve the purpose described above, one embodiment of the present disclosure provides a semiconductor memory device including a substrate, a plurality of capacitor structures, a stress insulating layer, and at least one interface layer. The capacitor structures are separately disposed on the substrate, and each of the capacitor structures includes a plurality of capacitors. The stress insulating layer is disposed on the substrate to cover the capacitor structures. The interface layer is disposed within the stress insulating layer, between any two adjacent ones of the capacitor structures, wherein a tip portion of the at least one interface layer is higher than a top surface of each of the capacitor structures.

To achieve the purpose described above, one embodiment of the present disclosure provides a method of fabricating a semiconductor memory device including the following steps. Firstly, a substrate is provided, and a plurality of capacitor structures is formed on the substrate, and each of the capacitor structures is separately from each other and includes a plurality of capacitors. The stress insulating layer is disposed on the substrate to cover the capacitor structures. The at least one interface layer is formed within the stress insulating layer, between any two adjacent ones of the capacitor structures, wherein a tip portion of the at least one interface layer is higher than a top surface of each of the capacitor structures.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are directed to provide a better understanding of the embodiments and are included as parts of the specification of the present disclosure. These drawings and descriptions are used to illustrate the principles of the embodiments. It should be noted that all drawings are schematic, and the relative dimensions and scales have been adjusted for the convenience of drawing. Identical or similar features in different embodiments are marked with identical symbols.

FIG. 2 to FIG. 3 are schematic diagrams illustrating a method of fabricating a semiconductor memory device according to a second embodiment of the present disclosure, in which:

FIG. 2 shows a schematic cross-sectional view of a semiconductor memory device after forming a stress insulating layer; and FIG. 3 shows a schematic cross-sectional view of a semiconductor memory device after performing a planarization process.

FIG. 4 to FIG. 5 are schematic diagrams illustrating a method of fabricating a semiconductor memory device according to a third embodiment of the present disclosure, in which:

FIG. 4 shows a schematic cross-sectional view of a semiconductor memory device after forming a stress insulating layer; and FIG. 5 shows a schematic cross-sectional view of a semiconductor memory device after performing a planarization process.

DETAILED DESCRIPTION

To provide a better understanding of the presented disclosure, preferred embodiments will be described in detail. The preferred embodiments of the present disclosure are illustrated in the accompanying drawings with numbered elements. In addition, the technical features in different embodiments described in the following may be replaced, recombined, or mixed with one another to constitute another embodiment without departing from the spirit of the present disclosure.

Figure 1:
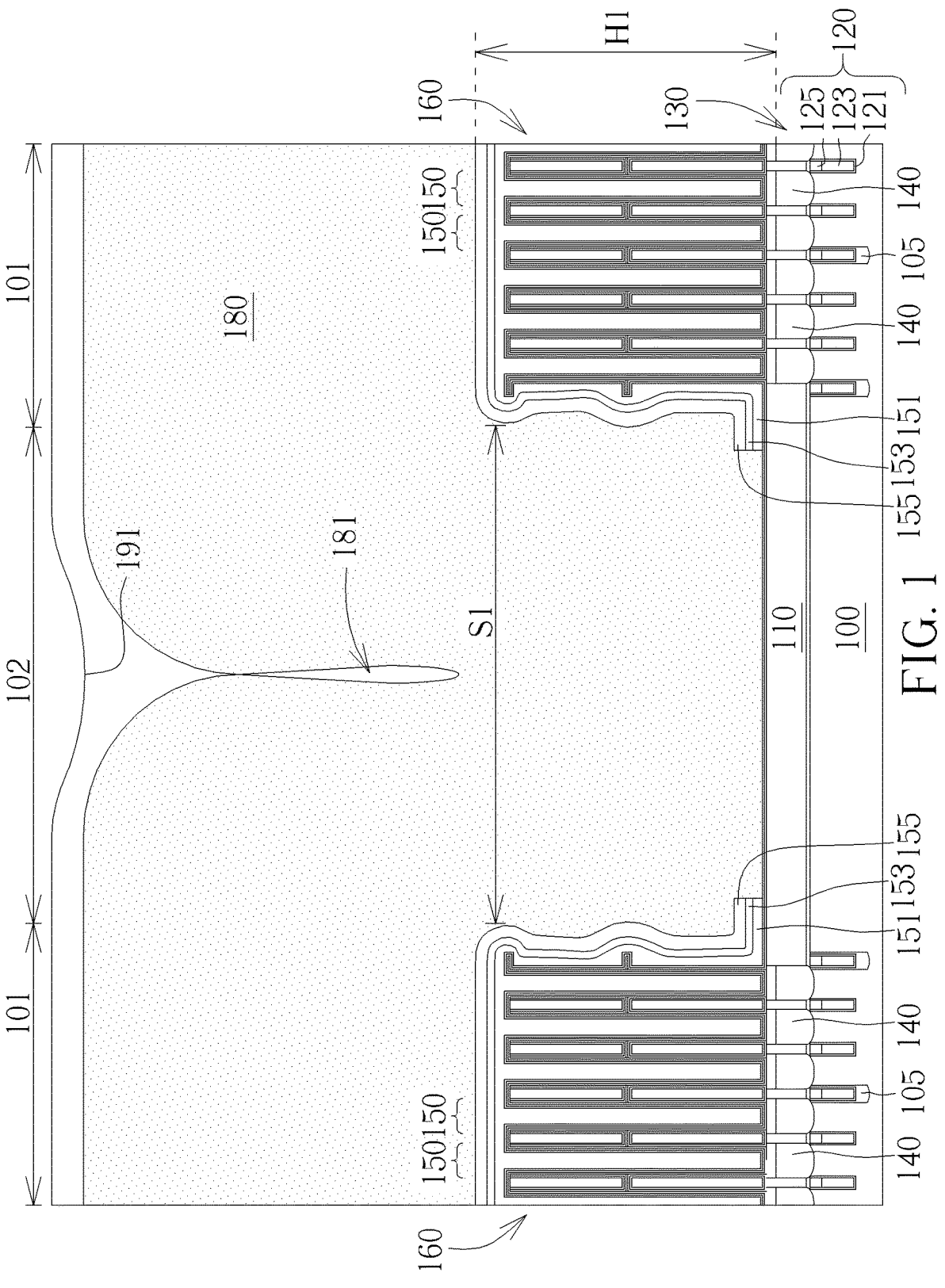
FIG. 1 is a schematic diagram illustrating a method of fabricating a semiconductor memory device according to a first embodiment of the present disclosure.

Please refer to FIG. 1, which is a schematic diagram illustrating a method of fabricating a semiconductor memory device 10 according to the first embodiment of the present disclosure. The semiconductor memory device 10 for example includes a dynamic random access memory (DRAM) device, which includes at least one transistor 130 and at least one capacitor 150, thereto serve as the smallest memory cell in the DRAM array for accepting signals from word lines (WLs) 120 and bit lines (BLs, not shown in the drawings) during the operation.

Precisely speaking, the semiconductor memory device 10 for example incudes a substrate 100 for example a silicon substrate, a silicon containing substrate (such as silicon carbide or silicon germanium), or a silicon-on-insulator (SOI) substrate, and the substrate 100 further includes a cell region 101 and a periphery region 102 disposed at a side of the cell region 101, disposed thereon. In the present embodiment, two cell regions 101 are defined on the substrate 100, and the periphery region 102 is disposed between the two cell regions 101 for separating therefrom, as shown in FIG. 1. People well skilled in the art should fully understand that the practical number, and the practical locations of the cell regions 101 and the periphery region 102 are not limited to be what is shown in FIG. 1, and which may all be adjusted based on product requirements. As shown in FIG. 1, at least one shallow trench isolation (STI) 105 is formed in the substrate 100 to define a plurality of active areas (AA, not shown in the drawings) in the substrate 100. The formation of the shallow trench isolation 105 is for example accomplished by firstly etching the substrate 100 to form a plurality of trenches (not shown in the drawing), and then filling the trenches with an insulating material (not shown in the drawing), such as silicon oxide ($SiO_x$), silicon nitride (SiN), or silicon oxynitride (SiON), but not limited thereto. Furthermore, a plurality of buried word lines (BWL) 120 is formed in the substrate 120, within the two cell regions 101, with the buried word lines 120 being extended parallel to each other along a direction to cross each of the active areas and the shallow trench isolation 105. Accordingly, a portion of each of the buried word lines 120 may be embedded in the shallow trench isolation 105, and another portion of each of the buried word lines 120 may be embedded in each of the active areas, as shown in FIG. 1.

Precisely speaking, each of the buried word lines 120 at lest includes a gate dielectric layer 121 for example including silicon oxide, a gate electrode layer 123 for example including a low-resistant metal like tungsten (W), aluminum (Al), or copper (Cu), and a capping layer 125 for example including an insulating material like silicon nitride, silicon oxynitride, or silicon carbonitride (SiCN). The formations of the gate dielectric layer 121, the gate electrode layer 123, and the capping layer 125 are accomplished by firstly forming a plurality of trenches (not shown in the drawings) in the substrate 100, forming the gate dielectric layer 121 entirely covering surfaces of each of the trenches, and the gate dielectric layer 123 filled up the bottom portion of each of the trenches, through a deposition, an etching and a planarization processes, and then, forming the capping layer 125 filled up the top portion of each of the trenches after an etching back process, with the topmost surface of the capping layer 125 being coplanar with the top surface of the substrate 100. In the present embodiment, each of the buried word lines 120 and two doped regions respectively formed at two sides thereof in the substrate 100 may together form a transistor 130.

Next, a dielectric layer 110 and a plurality of capacitor structures 160 are formed on the substrate 100, and each of the capacitor structures 160 are separately disposed on the substrate 100 to further include a plurality of capacitors 150. The capacitors 150 are electrically connected to the doped regions of each transistor 130 respectively, through a plurality of contact plugs 140 formed within the dielectric layer 110, as well as a silicide layer (not shown in the drawings) formed on surfaces of the substrate 100, as shown in FIG. 1. Accordingly, each of the capacitors 150 may serve as a storage node (SN), so as to together form the smallest memory cell with each transistor 130, thereby forming the DRAM: array. Precisely speaking, each of the capacitors 150 include a bottom electrode layer (not shown in the drawings), a capacitor dielectric layer (not shown in the drawings) for example including a dielectric material having a dielectric constant greater than 4 like hafnium oxide ($HfO_2$), and a top electrode layer (not shown in the drawings). The bottom electrode layer and the top electrode layer for example both includes a conductive material like tungsten, titanium (Ti), titanium nitride (TiN), tantalum (Ta), tantalum nitride (TaN), or aluminum, but not limited thereto. It is noted that, the bottom electrode layer, the capacitor dielectric layer and the top electrode layer of the present embodiment are all exemplified by conformally covering on a supporting structure (not shown in the drawings) disposed over the substrate 100, and the practical disposing example is not limited thereto, and which may be further adjusted based on product requirements. For example, in another embodiment, the bottom electrode layer may also include a vertical pillar shape, or the capacitor dielectric layer may further fill in the gap between each of the bottom electrode layers while covering on the bottom electrode layers, and the top electrode layer formed subsequently may entirely cover all of the bottom electrode layers, but not limited thereto.

Each of the capacitor structures 160 further includes a stacked layer structure stacked by one over another on the capacitors 150, and the formation the stacked layer structure includes but not limited to the following steps. Firstly, at least one deposition process for example a chemical vapor deposition (CVD) process or a physical vapor deposition (PVD) process is performed, to sequentially form a semiconductor layer 151 for example including a semiconductor material like polysilicon or silicon germanium (SiGe), a conductive layer 153 for example including a low-resistant metal material like tungsten or copper, and an insulating layer 155 for example including a dielectric layer like silicon oxide, on each of the capacitors 150, but is not limited thereto. In the present embodiment, the semiconductor layer 151 covers the substrate 100 and each capacitor 150, to directly contact the capacitors 150, and to further fill in the gap between each of the capacitors 150, and the conductive layer 153 and the insulating layer 155 formed subsequently are conformally disposed on the semiconductor layer 151. Besides to covering the capacitors 150, the semiconductor layer 151, the conductive layer 153, and the insulating layer 155 may further laterally extend to the periphery region 102 at two sides of the cell region 101. Then, an etching process is required to be performed through a mask layer (not shown in the drawings), to partially remove the stacked layer structure extended to the periphery region 102, thereby forming the capacitor structures 160, as shown in FIG. 1. It is noted that, two adjacent ones of the capacitor structures 160 are separately apart by a spacing S1, and the distance of the spacing S1 in a direction (namely, the horizontal direction) which is parallel to the top surface of the substrate 100 is substantially the same as a height H1 of the capacitor structures 160 in a direction (namely, the vertical direction) which is perpendicular to the top surface of the substrate 100, but is not limited thereto.

Following these, an insulating layer 180, and a dielectric layer 190 are sequentially formed on the substrate 100, wherein the insulating layer 180 for example includes silicon oxide, to cover each of the capacitor structures 160 and to further fill in the gap between each of the capacitor structures 160. Through these performances, the fabrication of the semiconductor memory device 10 according to the present embodiment is accomplished. The insulating layer 180 of the present embodiment is formed through a deposition process. It is noted that, while the insulating layer 180 is deposited into the gap between two adjacent ones of the capacitor structures 160, a seam 181 may be easily occurred over the spacing S1, due to the high aspect ratio of the capacitor structures 160. Accordingly, the dielectric layer 190 formed subsequently may therefore obtain a relative sunken top surface 191, as shown in FIG. 1. In this situation, at least one planarization process is required to be performed to planarize the top surface 191 of the dielectric layer 190, for removing the seam 181 in the insulating layer 180. However, if the seam 181 is extended to a wider range, for example, is extended to reach the height close to the top surface of each capacitor structure 160 in the vertical direction, the aforementioned planarization process may not capable to completely remove the seam 181. Then, the structural reliability of the semiconductor memory device 10 may be dramatically and negatively affected thereby.

People well-skilled in the art should fully understand that the semiconductor memory device may also be formed through other fabricating processes, or includes other features, which are not limited to be aforementioned steps and structures. The following description will detail the different embodiments of the semiconductor memory device and fabricating method thereof in the present disclosure. To simplify the description, the following description will detail the dissimilarities among the different embodiments and the identical features will not be redundantly described. In order to compare the differences between the embodiments easily, the identical components in each of the following embodiments are marked with identical symbols.

Figure 2:
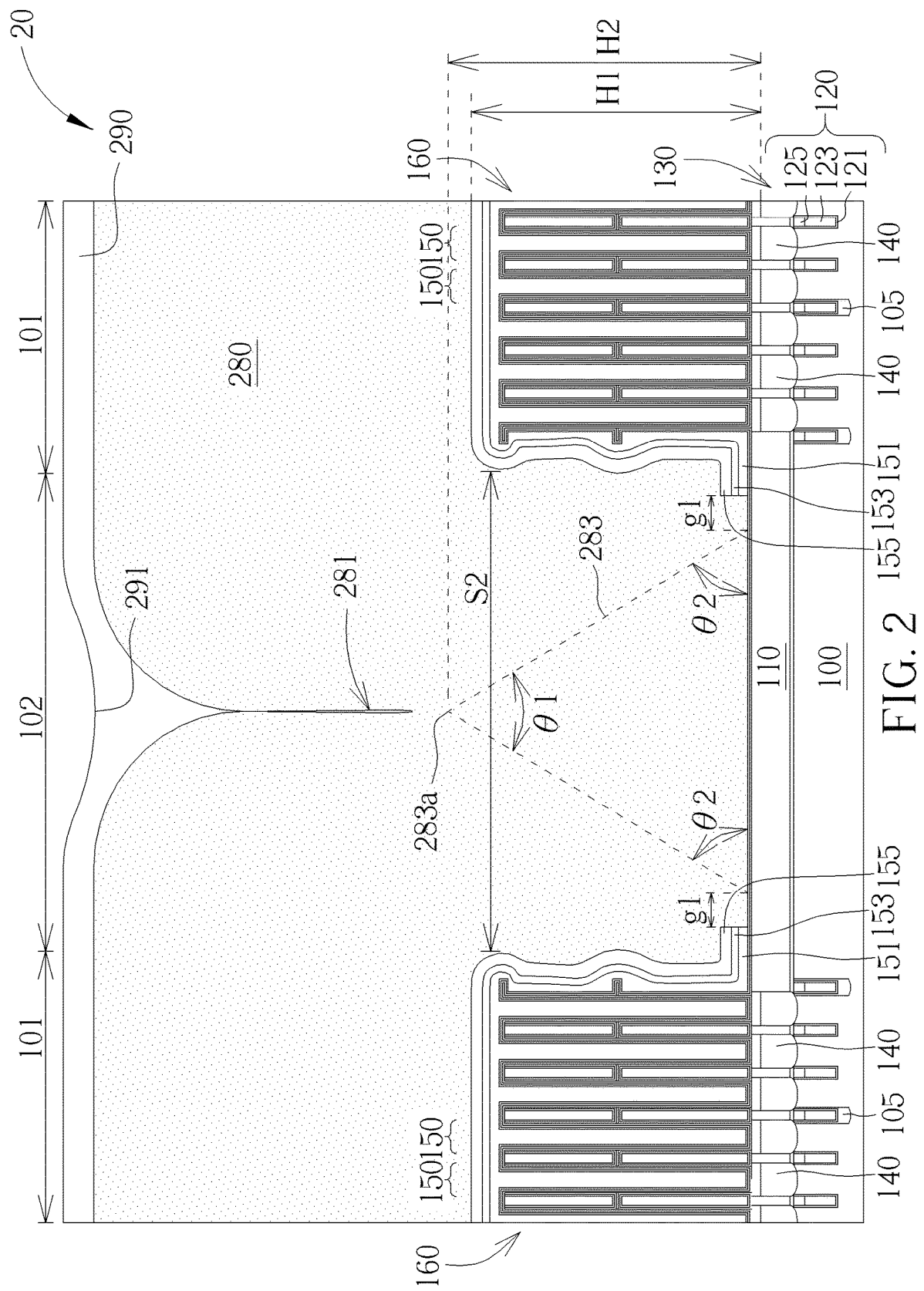
Figure 3:
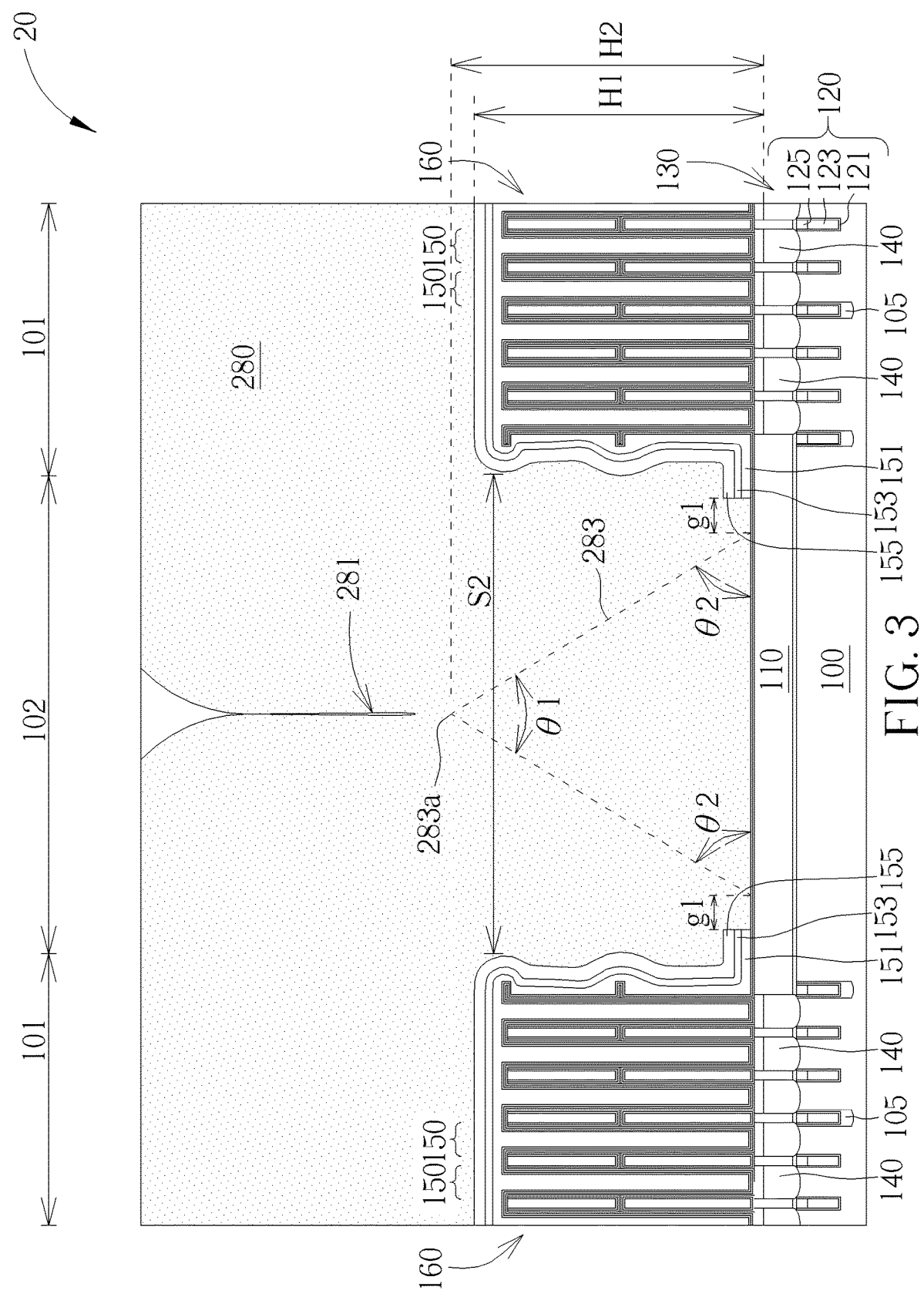

Please refer to FIG. 2 and FIG. 3, which are schematic diagrams illustrating a method of fabricating a semiconductor memory device 20 according to the second embodiment of the present disclosure. The previous steps of the present embodiment are substantially the same as those of the first embodiment, and which will not be redundantly described hereinafter. The difference between the present embodiment and the aforementioned first embodiment is mainly in that an insulating layer 280 is formed through a plasma-enhanced tetraethoxysilane (PETEOS) deposition process, and a relative greater spacing S2 is saved between two adjacent ones of the capacitor structures 160, wherein the distance of the spacing S2 in the horizontal direction is for example greater than the height H1 of the capacitor structures 160 in the vertical direction, preferable being greater than 1.5 times of the height H1.

Precisely speaking, as shown in FIG. 2, after forming the capacitor structures 160, the plasma-enhanced tetraethoxysilane deposition process is performed to form the insulating layer 280 on the substrate 100, with the insulating layer 280 including a dielectric material like silicon dioxide, and then, a dielectric layer 290 is formed on the insulating layer 280, wherein the dielectric layer 290 also includes a sunken top surface 291. It is noted that, while the insulating layer 280 is rapidly deposited in the spacing S2 between the two adjacent ones of the capacitor structures 160, a seam 281 is also easily occurred over the spacing S2. However, the relative greater spacing S2 will effectively reduce the forming range of the seam 281, and preferably, the seam 281 may therefore be formed only at a position which is higher than the height H1 of the capacitor structures 160, as shown in FIG. 2. On the other hand, the relative greater spacing S2 may initially compensate the redundant stress from the substrate 100 during rapidly depositing the insulating layer 280, so that, an interface layer 283 is formed within the insulating layer 280. The interface layer 283 has the same dielectric material as the insulating layer 280, but has a relatively greater density in comparison with that of the insulating layer 280.

It is noted that the interface layer 283 is formed between the two adjacent ones of the capacitor structures 160, below the seam 281, and which may include a triangular shape as shown in FIG. 2. Accordingly, a tip portion 283a of the interface layer 283 may include a closed angle $\theta 1$, which is for example smaller than two included angles $\theta 2$ at the bottom of the interface layer 283, wherein the included angles $\theta 2$ refer to the angle which is sandwiched between the side edge of the interface layer 283 and the top surface of the substrate 100, for example, being about 45±5 degrees to 45±10 degrees, but it is not limited thereto. Preferably, the tip portion 283a of the interface layer 283 may be higher than the top surface of each of the capacitor structures 160, so that, a height H2 of the interface layer 283 in the vertical direction may be greater than the height H1 of the capacitor structures 160, for example being about 1.5 to 1.5 times greater than the height H1, and the height H2 of the interface layer 283 is still smaller than the spacing S2 between two capacitor structures 160. It is also noted that, the interface layer 283 does not directly contact the capacitor structures 160 adjacent thereto, and the interface layer 283 is respectively spaced apart from the two adjacent capacitor structures 160 by a gap g1, as shown in FIG. 2, so as to prevent from causing any negative influence to the capacitor structures 160.

After that, as shown in FIG. 3, a planarization process is performed to remove the sunken top surface 291 of the dielectric layer 290, and the top surfaces of the dielectric layer 290 and the insulating layer 280 are planarized integrally, thereby completing the fabricating process of the semiconductor memory device 20 of the present embodiment. Then, another planarization process (not shown in the drawings) may be formed additionally to further remove the seam 281 of the insulating layer 280.

According to the fabricating method of the present embodiment, the plasma-enhanced tetraethoxysilane deposition process is performed by rapidly depositing the insulating layer 280 in the spacing S2 between the two adjacent ones of the capacitor structures 160, so as to effectively reduce the forming range of the seam 281. In this way, the location where the seam 281 is formed may be limited to a position higher than the height H1 of the capacitor structures 160, and the seam 281 is allowable to be completely removed by performing another planarization process in the subsequent process. In addition, the relative greater spacing S2 will initially compensate the redundant stress from the substrate 100 while rapidly depositing the insulating layer 280, and the interface layer 283 with the same material and relatively greater density is therefore formed in the insulating layer 280, for example, in a triangular shape as shown in FIG. 2, but not limited thereto.

Furthermore, people well-skilled in the art should easily understand that in a preferably embodiment, a stress testing process may be additionally performed before the plasma-enhanced tetraethoxysilane deposition process, to measure the stress mode of the substrate 100, and to further adjust the material of the insulating layer 280 according to the stress mode of the substrate 100. For example, while the substrate 100 includes a compressive stress mode, and an additional tensile stress is requested to be applied through the insulating layer 280 for buffering the tensile stress. On the other hands, while the substrate 100 includes a tensile stress, and an additional compressive stress is requested to be applied through the insulating layer 280 for buffering the tensile stress. Thus, the insulating layer 280 may include other suitable materials such as silicon nitride to provide a tensile stress or a compressive stress according to the stress mode of the substrate 100, but is not limited thereto.

Figure 4:
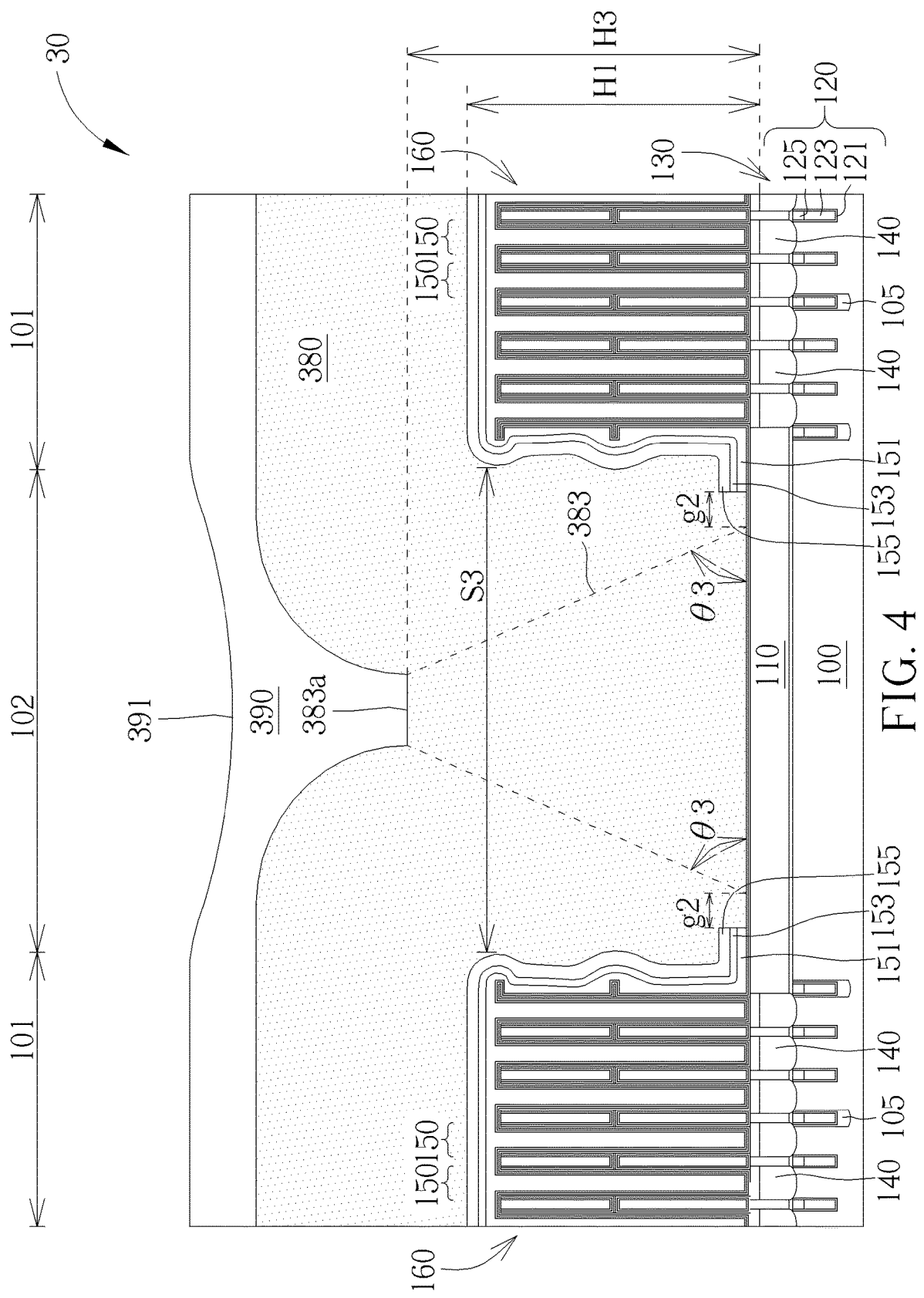
Figure 5:
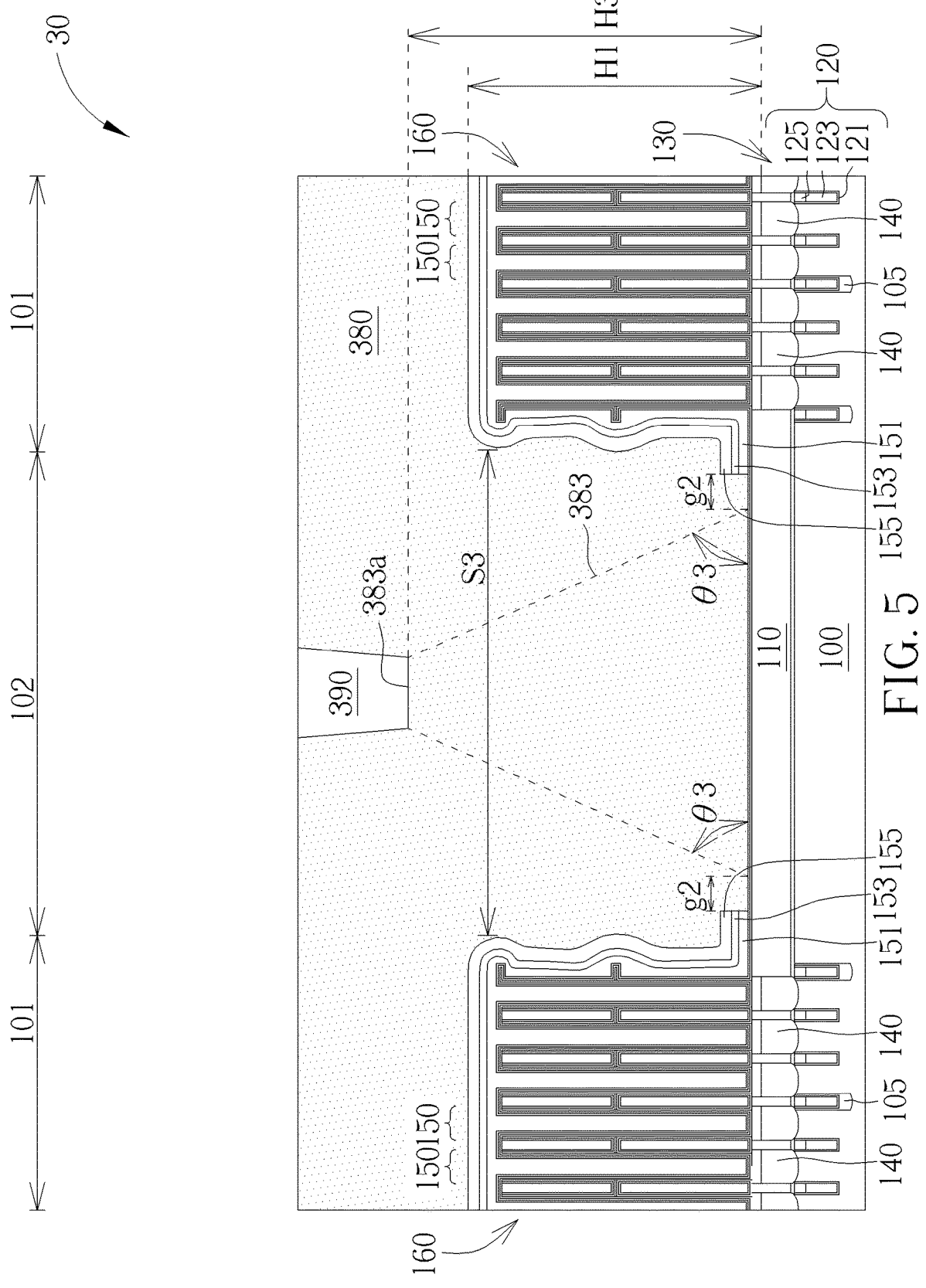

Please refer to FIG. 4 to FIG. 5, which are schematic diagrams illustrating a method of fabricating a semiconductor memory device 30 according to the third embodiment of the present disclosure. The previous steps of the present embodiment are substantially the same as those of the first embodiment or the second embodiment, and which will not be redundantly described hereinafter. The difference between the present embodiment and the aforementioned embodiments is mainly in that a relative greater spacing S3 is saved between two adjacent ones of the capacitor structures 160, and preferably, the distance of the spacing S3 in the horizontal direction is for example about two times greater than the height H1 of the capacitor structures 160 in the vertical direction.

Precisely speaking, in the present embodiment the plasma-enhanced tetraethoxysilane deposition process is also performed to form an insulating layer 380 on the substrate 100, with the insulating layer 380 including a dielectric material like silicon dioxide, and then, a dielectric layer 390 is formed on the insulating layer 380, wherein the dielectric layer 390 also includes a sunken top surface 391. It is noted that, while the insulating layer 380 is rapidly deposited within the spacing S2 between the two adjacent ones of the capacitor structures 160, the relatively greater spacing S3 may further optimize the deposition quality of the insulating layer 380, so as to successfully avoid the occurrence of the seam. Meanwhile, the relative greater spacing S3 may initially compensate the redundant stress from the substrate 100 during rapidly depositing the insulating layer 380, so that, an interface layer 383 is formed within the insulating layer 380, with the interface layer 383 having the same material and relatively greater density than that of the insulating layer 380, for example being in a trapezoidal shape as shown in FIG. 4, but not limited thereto.

In the present embodiment, the interface layer 383 is also formed between two adjacent ones of the capacitor structures 160. Since the interface layer 383 has a trapezoidal shape, a tip portion 383a thereof may include a surface, and the two included angle θ3 (referring to the angle sandwiched between the side edge of the interface layer 383 and the top surface of the substrate 100) at the bottom of the interface layer 383 are also about 45±5 degrees to 45±10 degrees, but not limited thereto. Preferably, the tip portion 383a of the interface layer 383 is higher than the top surface of the capacitor structures 160, so that, a height H3 of the interface layer 383 in the vertical direction may be higher than the height H1 of the capacitor structures 160, for example being about 1.8 to 2 times greater than the height H1, and the height H3 of the interface layer 383 is still smaller than the distance of the spacing S3 between two adjacent ones of the capacitor structures 160 in the horizontal direction. It is also noted that, the interface layer 383 does not directly contact two capacitor structures 160 adjacent thereto, and the interface layer 383 is respectively spaced apart from the two adjacent capacitor structures 160 by a gap g2, as shown in FIG. 4, so as to prevent from causing any negative influence to the capacitor structures 160.

After that, as shown in FIG. 5, a planarization process is performed to remove the sunken top surface 391 of the dielectric layer 390, and the top surfaces of the dielectric layer 390 and the insulating layer 380 are planarized integrally, thereby completing the fabricating process of the semiconductor memory device 30 of the present embodiment. With these arrangements, the insulating layer 380 may therefore serve a stress insulating layer, for buffering the redundant stress from the substrate 100 that is not completely eliminated, thereby reducing the impact of the stress from the substrate 100, and further improving the structural reliability of the semiconductor memory device 30. In the present embodiment, a stress testing process may be additionally performed before the plasma-enhanced tetraethoxysilane deposition process, to measure the stress mode of the substrate 100, and to further adjust the material of the insulating layer 380 according to the stress mode (being tensile stress or compressive stress) of the substrate 100, with the insulating layer 380 including other suitable material like silicon nitride for providing additional compressive stress or tensile stress for buffering the stress of the substrate 100, but not limited thereto.

Accordingly, the fabricating method of the present embodiment is sufficient to avoid the occurrence of seam, thus that, the additional planarization process in the subsequent process may be omitted, and also, the redundant stress from the substrate 100 during rapidly depositing the insulating layer 380 may be preliminarily compensated thereby, so as to from the interface layer 383 with the same material and relatively higher density within the insulating layer 380. The interface layer 383 for example includes a trapezoidal shape as shown in FIG. 4, and which may serve as a stress insulating layer to compensate the redundant stress from the substrate 100 that is not completely eliminated, thereby reducing the impact of the stress from the substrate 100, and further improving the structural reliabilities of the semiconductor memory device 30.

Figure 6:
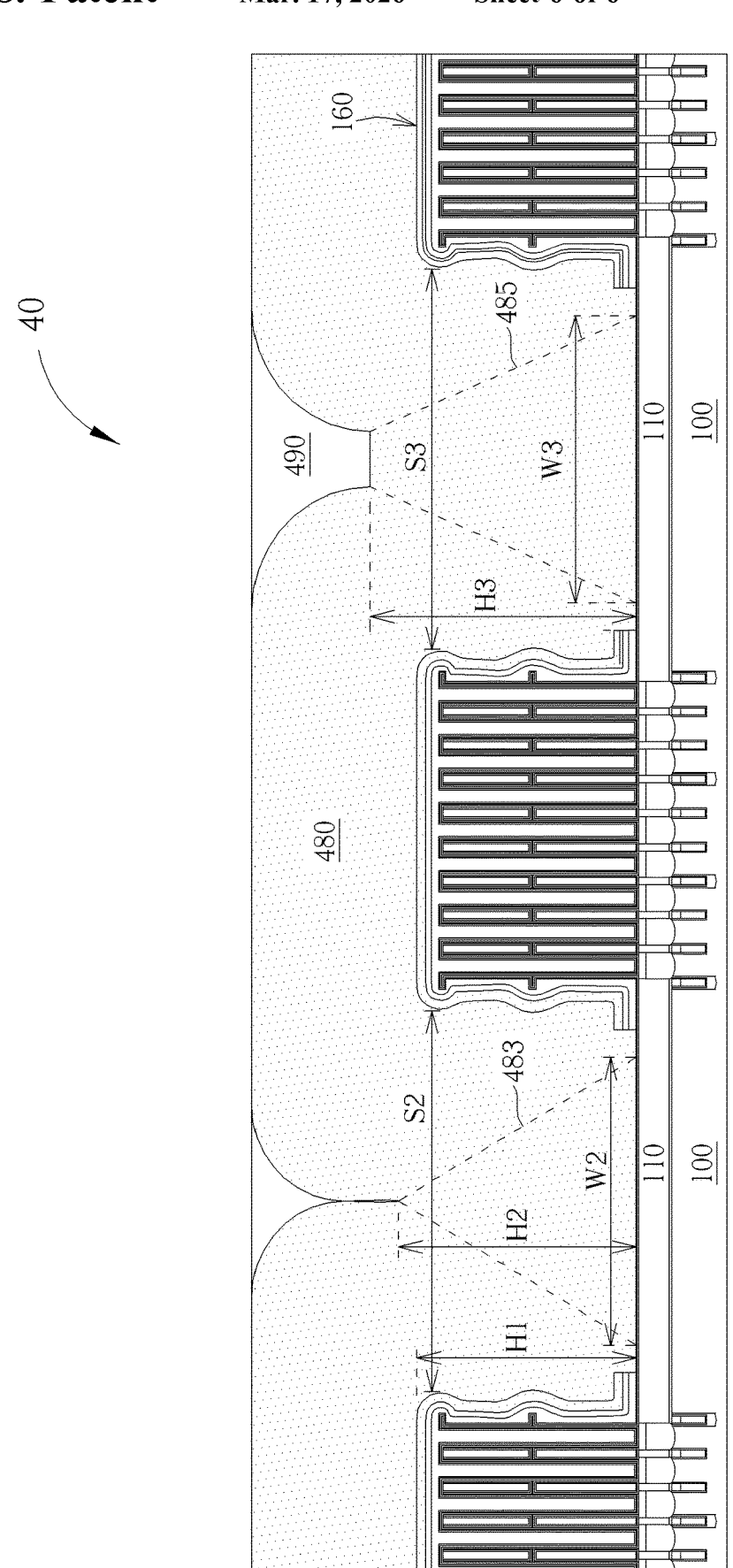
FIG. 6 is a schematic diagram illustrating a method of fabricating a semiconductor memory device according to a fourth embodiment of the present disclosure.

Please refer to FIG. 6, which is a schematic diagram illustrating a method of fabricating a semiconductor memory device 40 according to the fourth embodiment of the present disclosure. The previous steps of the present embodiment are substantially the same as those of the second embodiment or the third embodiment, and which will not be redundantly described hereinafter. The difference between the present embodiment and the aforementioned embodiments is mainly in that various spacings such as a first spacing S1, a second spacing S2 are respectively formed between any two adjacent ones of the capacitor structures 160, and the first spacing S1 and the second spacing S2 are different from each other, and the distances of both in the horizontal direction is greater than the height H1 of the capacitor structures 160 in the vertical direction.

Precisely speaking, in the present embodiment the plasma-enhanced tetraethoxysilane deposition process is also performed to form an insulating layer 480 on the substrate 100, with the insulating layer 480 including a dielectric material like silicon dioxide, and then, a dielectric layer 490 is formed on the insulating layer 480. It is noted that, while the insulating layer 480 is rapidly deposited within the first spacing S2, the second spacing S3 between two adjacent ones of the capacitor structures 160, a first interface layer 483 and a second interface layer 485 with the same material and relatively higher density may be respectively formed in the insulating layer 480 based on different stress compensation, and the first interface layer 483 and the second interface layer 485 are respectively formed over the first spacing S2 and the second spacing S3, as shown in FIG. 6, but not limited thereto. Among them, the first interface layer 483 for example has a triangular shape, and the second interface layer 485 for example has a trapezoidal shape, with a bottom width W2 of the first interface layer 483 in the horizontal direction being different from a bottom width W3 of the second interface layer 485 in the horizontal direction, and with a height H2 of the first interface layer 483 in the vertical direction also being different from a height H3 of the second interface layer 485 in the vertical direction. However, both of the bottom width W2 of the first interface layer 483 and the bottom width W3 of the second interface layer 485 are greater than the height H1 of the capacitor structure 160 in the vertical direction, for example, being greater than about 1.5 or 2 times of the height H1, but not limited thereto.

Following these, a planarization process (not shown in the drawings) may be performed to further remove the sunken top surface (not shown in the drawings) of the dielectric layer 490, and the top surfaces of the dielectric layer 490 and the insulating layer 480 are planarized integrally, thereby completing the fabricating process of the semiconductor memory device 40 of the present embodiment. Accordingly, the fabricating method of the present embodiment is also sufficient to avoid or to improve the occurrence of seam, as well as to preliminarily compensate the stress from the substrate 100 during rapidly depositing the insulating layer 480. Then, the first interface layer 483, the second interface layer 485 with the same material and relatively higher density are formed within the insulating layer 480, over the first spacing S2 and the second spacing S3 respectively. The first interface layer 483 and the second interface layer 485 for example included a triangular shape or a trapezoidal shape may therefore serve as a stress insulating layer to buffer the redundant stress from the substrate 100 that is not completely eliminated, thereby reducing the impact of the stress from the substrate 100, and further improving the structural reliabilities of the semiconductor memory device 40.

Overall speaking, the fabricating method of the present disclosure utilizes performing the plasma-enhanced tetraethoxysilane deposition process, as well as forming a relative greater spacing between the adjacent capacitor structures to effectively avoid the occurrence of seams in the insulating layer. Also, through the fabricating method of the present disclosure, the relative greater spacing between the adjacent capacitor structures is allowable to compensate the stress from the substrate while rapidly depositing the insulating layer, so as to form the interface layer with the same material and relatively higher density within the insulating layer, with the interface layer for example including a triangular shape or a trapezoidal shape. Thus, the interface layer may therefore serve as a stress insulating layer to buffer the stress from the substrate that is not completely eliminated, thereby reducing the impact of the stress from the substrate, and further improving the structural reliabilities of the semiconductor memory device.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A semiconductor memory device, comprising:
a substrate;
a plurality of capacitor structures, separately disposed on the substrate, each of the capacitor structures comprises a plurality of capacitors;
a stress insulating layer, disposed on the substrate and covered the capacitor structures; and
at least one interface layer, disposed within the stress insulating layer, between any two adjacent ones of the capacitor structures, wherein a tip portion of the at least one interface layer is higher than a top surface of each of the capacitor structures, wherein at least two surfaces of the at least one interface layer directly contacts the stress insulating layer, and one of the at least two surfaces of the at least one interface layer has an acute angle related to a top surface of the substrate.

2. The semiconductor memory structure according to claim 1, wherein the at least one interface layer comprises a trapezoidal shape and the tip portion comprises a horizontal surface.

3. The semiconductor memory structure according to claim 1, wherein the at least one interface layer comprises a triangular shape, and the tip portion comprises a closed angle.

4. The semiconductor memory structure according to claim 3, wherein the acute angle comprises a degree greater than a degree of the closed angle.

5. The semiconductor memory structure according to claim 1, wherein a first distance and a second distance are disposed between the two adjacent ones of the capacitor structures, the at least one interface layer comprises a first interface layer disposed above the first distance, and a second interface layer disposed above the second distance, and a bottom width of the first interface layer is different from a bottom width of the second interface layer.

6. The semiconductor memory structure according to claim 5, wherein a first distance and a second distance are disposed between the any two adjacent ones of the capacitor structures, the at least one interface layer comprises a first interface layer disposed above the first distance, and a second interface layer disposed above the second distance, and a height of the first interface layer is different from a height of the second interface layer.

7. The semiconductor memory structure according to claim 1, wherein the at least one interface layer is spaced apart from the two adjacent ones of the capacitor structures, without directly contacting the two adjacent ones of the capacitor structures.

8. The semiconductor memory structure according to claim 1, wherein a distance between the two adjacent ones of the capacitor structures is greater than a height of each of the capacitor structures.

9. The semiconductor memory structure according to claim 1, wherein a distance between the two adjacent ones of the capacitor structures is greater than a height of the at least one interface layer.

10. The semiconductor memory structure according to claim 1, wherein at least one interface layer and the stress insulating layer comprises the same dielectric material layer.

11. The semiconductor memory structure according to claim 1, wherein a material density of the at least one interface layer is greater than a material density of the stress insulating layer.

12. A method of fabricating a semiconductor memory device, comprising:

providing a substrate;

forming a plurality of capacitor structures on the substrate, each of the capacitor structures being separately from each other and comprising a plurality of capacitors;

forming a stress insulating layer on the substrate and covered the capacitor structures; and forming at least one interface layer within the stress insulating layer, between any two adjacent ones of the capacitor structures, wherein a tip portion of the at least one interface layer is higher than a top surface of each of the capacitor structures, wherein at least two surfaces of the at least one interface layer directly contact the stress insulating layer, and one of the at least two surfaces of the at least one interface layer has an acute angle related to a top surface of the substrate.

13. The method of fabricating the semiconductor memory structure according to claim 12, wherein a plasma-enhanced tetraethoxysilane process is performed on the substrate, to form the stress insulating layer and the at least one interface layer.

14. The method of fabricating the semiconductor memory structure according to claim 13, wherein the at least one interface layer comprises a triangular shape, and the tip portion comprises a closed angle.

15. The method of fabricating the semiconductor memory structure according to claim 14, wherein the acute angle comprises a degree greater than a degree of the closed angle.

16. The method of fabricating the semiconductor memory structure according to claim 13, further comprising:

performing a planarization process after the plasma-enhanced tetraethoxysilane process, to partially remove the stress insulating layer and at least one interface layer.

17. The method of fabricating the semiconductor memory structure according to claim 13, wherein the at least one interface layer comprises a trapezoidal shape and the tip portion comprises a horizontal surface.

18. The method of fabricating the semiconductor memory structure according to claim 13, further comprising:

performing a stress testing process before the plasma-enhanced tetraethoxysilane process, to measure the stress mode of the substrate; and compensating the stress mode of the substrate through forming the stress insulating layer.

19. The method of fabricating the semiconductor memory structure according to claim 18, wherein the substrate comprises a tensile stress, and the stress insulating layer comprises a compressive stress.

20. A semiconductor memory device, comprising:

a substrate;

a plurality of capacitor structures, separately disposed on the substrate, each of the capacitor structures comprises a plurality of capacitors;

a stress insulating layer, disposed on the substrate and covered the capacitor structures, wherein the stress insulating layer comprising a first portion not directly contacting the plurality of capacitor structures and a second portion directly contacting the plurality of capacitor structures; and at least one interface layer, disposed within the stress insulating layer, between any two adjacent ones of the capacitor structures, wherein a tip portion of the at least one interface layer is higher than a top surface of each of the capacitor structures, the first portion of the stress insulating layer is higher than the tip portion and the second portion of the stress insulating layer is equal to and lower than the tip portion, the at least one interface layer is disposed within the second portion of the stress insulating layer, and the at least one interface layer and the stress insulating layer comprise a same dielectric material layer and different material densities.

* * * * *